(12) United States Patent
Yamazaki

(10) Patent No.: US 9,159,939 B2
(45) Date of Patent: Oct. 13, 2015

(54) PHOTOELECTRIC CONVERSION DEVICE

(75) Inventor: Shunpei Yamazaki, Tokyo (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 448 days.

(21) Appl. No.: 13/539,547

(22) Filed: Jul. 2, 2012

(65) Prior Publication Data

US 2013/0020568 A1 Jan. 24, 2013

(30) Foreign Application Priority Data

Jul. 21, 2011 (JP) ................................. 2011-159797

(51) Int. Cl.
*H01L 31/0224* (2006.01)
*H01L 51/42* (2006.01)
*H01L 31/0747* (2012.01)
*H01L 31/20* (2006.01)
*H01L 51/00* (2006.01)

(52) U.S. Cl.
CPC ........ *H01L 51/4213* (2013.01); *H01L 31/0747* (2013.01); *H01L 31/202* (2013.01); *H01L 51/006* (2013.01); *H01L 51/0053* (2013.01); *H01L 51/0072* (2013.01); *Y02E 10/547* (2013.01); *Y02E 10/549* (2013.01)

(58) Field of Classification Search
CPC .................. H01L 31/022466; H01L 31/0747; H01L 31/202
See application file for complete search history.

(56) References Cited

U.S. PATENT DOCUMENTS

| | | | |
|---|---|---|---|
| 5,213,628 A | 5/1993 | Noguchi et al. | |
| 5,482,570 A | 1/1996 | Saurer et al. | |
| 5,783,292 A | 7/1998 | Tokito et al. | |
| 6,191,353 B1 * | 2/2001 | Shiotsuka et al. | 136/256 |
| 6,310,282 B1 | 10/2001 | Sakurai et al. | |
| 6,683,244 B2 | 1/2004 | Fujimori et al. | |
| 7,158,161 B2 | 1/2007 | Gyoutoku et al. | |
| 7,288,887 B2 | 10/2007 | Aziz et al. | |
| 7,291,782 B2 | 11/2007 | Sager et al. | |
| 7,626,198 B2 | 12/2009 | Hirakata et al. | |

(Continued)

FOREIGN PATENT DOCUMENTS

| | | |
|---|---|---|
| JP | 04-130671 | 5/1992 |
| JP | 09-063771 | 3/1997 |

(Continued)

*Primary Examiner* — Jayne Mershon
(74) *Attorney, Agent, or Firm* — Nixon Peabody LLP; Jeffrey L. Costellia

(57) ABSTRACT

Provided is a photoelectric conversion device with high conversion efficiency in which the light loss due to light absorption in a window layer is significantly reduced by using a light-transmitting semiconductor layer comprising an organic compound and an inorganic compound. Specifically, the photoelectric conversion device includes: over one surface of a crystalline silicon substrate, a first silicon semiconductor layer; a light-transmitting semiconductor layer; a second silicon semiconductor layer which is partially formed on the light-transmitting semiconductor layer; and a first electrode. The photoelectric conversion device further includes: a third silicon semiconductor layer on the other surface of the crystalline silicon substrate; a fourth silicon semiconductor layer formed on the third silicon semiconductor layer; and a second electrode formed on the fourth silicon semiconductor layer. The light-transmitting semiconductor layer is formed using an organic compound and an inorganic compound, which contributes to the high light-transmitting property of the window layer.

11 Claims, 9 Drawing Sheets

(56) References Cited

U.S. PATENT DOCUMENTS

| | | |
|---|---|---|
| 7,732,808 B2 | 6/2010 | Ikeda et al. |
| 7,871,849 B2 | 1/2011 | Arai |
| 7,888,167 B2 * | 2/2011 | Yamazaki et al. ............... 438/96 |
| 7,989,694 B2 | 8/2011 | Iwaki |
| 8,049,102 B1 * | 11/2011 | Lee et al. ...................... 136/258 |
| 8,080,934 B2 | 12/2011 | Kido et al. |
| 8,101,857 B2 | 1/2012 | Kido et al. |
| 2005/0084712 A1 | 4/2005 | Kido et al. |
| 2005/0098207 A1 | 5/2005 | Matsumoto et al. |
| 2005/0106419 A1 | 5/2005 | Endoh et al. |
| 2006/0162770 A1 * | 7/2006 | Matsui et al. ................ 136/263 |
| 2007/0007516 A1 | 1/2007 | Seo et al. |
| 2007/0008257 A1 | 1/2007 | Seo et al. |
| 2009/0139558 A1 | 6/2009 | Yamazaki et al. |
| 2009/0165854 A1 | 7/2009 | Yamazaki et al. |
| 2011/0000545 A1 | 1/2011 | Nishi et al. |
| 2011/0041910 A1 | 2/2011 | Shimomura et al. |
| 2012/0097244 A1 * | 4/2012 | Adachi et al. ................. 136/256 |

FOREIGN PATENT DOCUMENTS

| | | |
|---|---|---|
| JP | 10-135497 | 5/1998 |
| JP | 11-307259 | 11/1999 |
| JP | 2000-315580 | 11/2000 |
| JP | 2005-026121 | 1/2005 |
| JP | 2005-251587 | 9/2005 |

* cited by examiner

PHOTOELECTRIC CONVERSION DEVICE

BACKGROUND OF THE INVENTION

1. Field of the Invention

The present invention relates to a photoelectric conversion device including a window layer formed using an organic compound and an inorganic compound.

2. Description of the Related Art

In recent years, photoelectric conversion devices that do not produce carbon dioxide during power generation have received attention as a measure against global warming. As typical examples thereof, solar cells have been known which use crystalline silicon substrates such as single crystalline and polycrystalline silicon substrates.

In solar cells using a crystalline silicon substrate, a structure having so-called homo junction is widely used. In such a structure, a layer having the conductivity type opposite to that of the crystalline silicon substrate is formed on one surface side of the crystalline silicon substrate by diffusion of impurities.

Alternatively, a structure with hetero junction in which amorphous silicon having different optical band gap and conductivity type from those of a crystalline silicon substrate is formed on one surface side of the crystalline silicon substrate is known (see Patent Documents 1 and 2).

REFERENCE

Patent Document

[Patent Document 1] Japanese Published Patent Application No. H04-130671
[Patent Document 2] Japanese Published Patent Application No. H10-135497

SUMMARY OF THE INVENTION

In the above photoelectric conversion device, since crystalline silicon or amorphous silicon is used for a window layer, the light loss due to light absorption in the window layer is caused.

Although photo-carriers are generated also in the window layer, minority carriers are likely to be recombined in the window layer; thus, photo-carriers extracted as current are almost generated on a back electrode side in the crystalline silicon substrate, which is the opposite side of the p-n junction. That is, light absorbed in the window layer is not substantially utilized, and accordingly, the window layer is preferably formed using a material having a light-transmitting property with respect to light in a wavelength range where crystalline silicon has optical sensitivity.

Thus, an object of one embodiment of the present invention is to provide a photoelectric conversion device which has little light loss caused by light absorption in the window layer.

One embodiment of the present invention disclosed in this specification is a photoelectric conversion device including a p-type light-transmitting semiconductor layer which is formed using an organic compound and an inorganic compound as a window layer and a p$^+$-type silicon semiconductor layer which is provided below a grid electrode.

Another embodiment of the present invention disclosed in this specification is a photoelectric conversion device including: a crystalline silicon substrate; a first silicon semiconductor layer formed on one surface of the crystalline silicon substrate; a light-transmitting semiconductor layer formed over the first silicon semiconductor layer; a second silicon semiconductor layer which is partially formed over the light-transmitting semiconductor layer; a first electrode formed over the second silicon semiconductor layer; a third silicon semiconductor layer formed over the other surface of the crystalline silicon substrate; a fourth silicon semiconductor layer formed over the third silicon semiconductor layer; and a second electrode formed over the fourth silicon semiconductor layer.

Note that the ordinal numbers such as "first" and "second" in this specification, etc. are assigned in order to avoid confusion among components, but not intended to limit the number or order of the components.

Another embodiment of the present invention disclosed in this specification is a photoelectric conversion device including: a crystalline silicon substrate; a first silicon semiconductor layer which is partially formed over one surface of the crystalline silicon substrate; a second silicon semiconductor layer formed over the first silicon semiconductor layer; a first electrode formed over the second silicon semiconductor layer; a light-transmitting semiconductor layer covering the one surface of the crystalline silicon substrate and the layers stacked over the one surface of the crystalline silicon substrate; a third silicon semiconductor layer formed over the other surface of the crystalline silicon substrate; a fourth silicon semiconductor layer formed over the third silicon semiconductor layer; and a second electrode formed over the fourth silicon semiconductor layer.

Another embodiment of the present invention disclosed in this specification is a photoelectric conversion device including: a crystalline silicon substrate; a first silicon semiconductor layer formed over one surface of the crystalline silicon substrate; a second silicon semiconductor layer which is partially formed over the first silicon semiconductor layer; a first electrode formed over the second silicon semiconductor layer; a light-transmitting semiconductor layer covering the first silicon semiconductor layer and the layers stacked over the first silicon semiconductor layer; a third silicon semiconductor layer formed over the other surface of the crystalline silicon substrate; a fourth silicon semiconductor layer formed over the third silicon semiconductor layer; and a second electrode formed over the fourth silicon semiconductor layer.

The first silicon semiconductor layer and the third silicon semiconductor layer can be i-type silicon semiconductor layers.

It is preferable that the crystalline silicon substrate have n-type conductivity and that the second silicon semiconductor layer have p-type conductivity. Furthermore, it is preferable that the fourth silicon semiconductor layer have n-type conductivity and higher carrier concentration than the crystalline silicon substrate. Moreover, it is preferable that the light-transmitting semiconductor layer have p-type conductivity.

The light-transmitting semiconductor layer can be a layer formed using an organic compound and an inorganic compound.

The inorganic compound is preferably an oxide of a metal belonging to any of Groups 4 to 8 of the periodic table. Specifically, vanadium oxide, niobium oxide, tantalum oxide, chromium oxide, molybdenum oxide, tungsten oxide, manganese oxide, rhenium oxide, or the like can be used.

As the organic compound, any of an aromatic amine compound, a carbazole derivative, aromatic hydrocarbon, and a heterocyclic compound having a dibenzofuran skeleton or a dibenzothiophene skeleton can be used. The organic compound may be a polymer.

Further, a light-transmitting conductive film may be formed in contact with the light-transmitting semiconductor layer.

Furthermore, the second silicon semiconductor layer preferably has a higher carrier concentration than the light-transmitting semiconductor layer.

Moreover, a structure in which the fourth silicon semiconductor layer is replaced with a light-transmitting conductive film may be employed.

According to one embodiment of the present invention, a photoelectric conversion device in which the amount of light loss due to light absorption in a window layer is small and which has high conversion efficiency can be provided.

DETAILED DESCRIPTION OF THE INVENTION

Figure 1A:
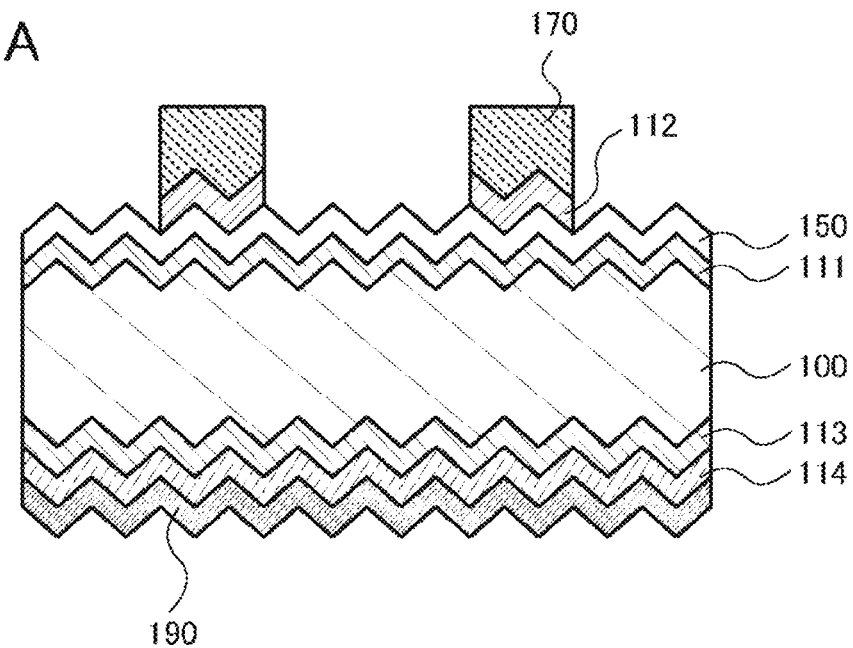
FIGS. 1A and 1B are cross-sectional views each illustrating a photoelectric conversion device according to one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

Embodiment 1

In this embodiment, a photoelectric conversion device according to one embodiment of the present invention and a method for manufacturing the photoelectric conversion device will be described.

FIG. 1A is a cross-sectional view of a photoelectric conversion device according to one embodiment of the present invention. The photoelectric conversion device includes a crystalline silicon substrate 100 and further includes, over one surface of the crystalline silicon substrate, a first silicon semiconductor layer 111, a light-transmitting semiconductor layer 150, a second silicon semiconductor layer 112, and a first electrode 170. Furthermore, the photoelectric conversion device includes a third silicon semiconductor layer 113 on the other surface of the crystalline silicon substrate, a fourth silicon semiconductor layer 114 formed on the third silicon semiconductor layer 113, and a second electrode 190 formed on the fourth silicon semiconductor layer 114. Note that the first electrode 170 is a grid electrode, and the first electrode 170 side serves as a light-receiving surface. The second electrode 190 may be a grid electrode, and both sides of the crystalline silicon substrate 100 may serve as light-receiving surfaces.

Further, FIG. 1A illustrates an example in which a surface (front surface) and a back surface (rear surface) of the crystalline silicon substrate 100 are processed to have unevenness. On the surface processed to have unevenness, multiply-reflected light is incident, and the light obliquely propagates into a photoelectric conversion region; thus, the optical path length is increased. In addition, a so-called light trapping effect in which light reflected by the back surface is totally reflected by the surface can occur.

Figure 1B:
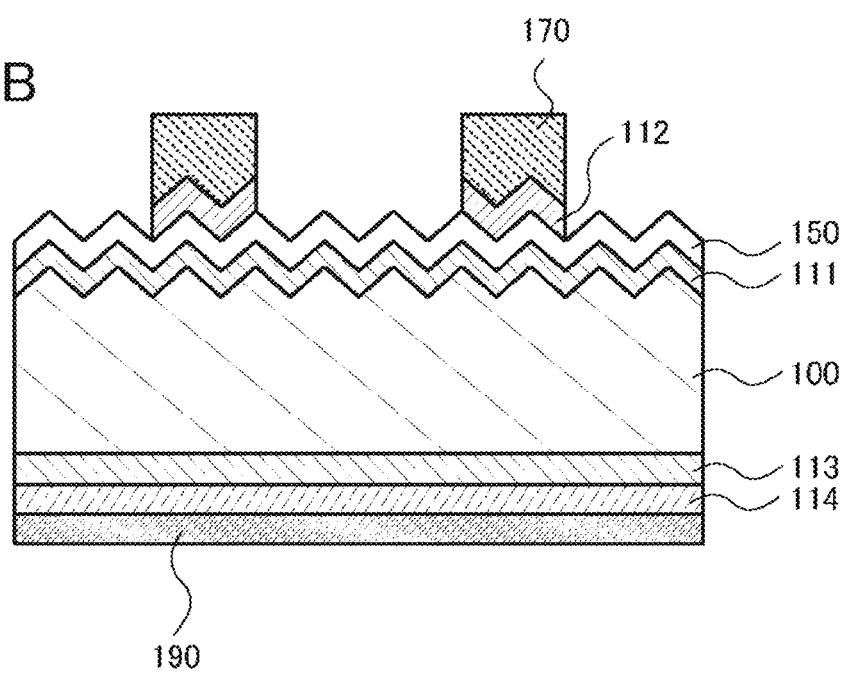

Note that as illustrated in FIG. 1B, a structure in which only one of surfaces (the front surface and the back surface) is processed to have unevenness may be employed. The surface area of the crystalline silicon substrate is increased by the unevenness; thus, while the optical effect described above can be obtained, the absolute amount of surface defects is increased. Therefore, in consideration of the balance between the optical effect and the amount of the surface defects, a practitioner may determine the structure so that more favorable electric characteristics can be obtained.

Figure 8A:
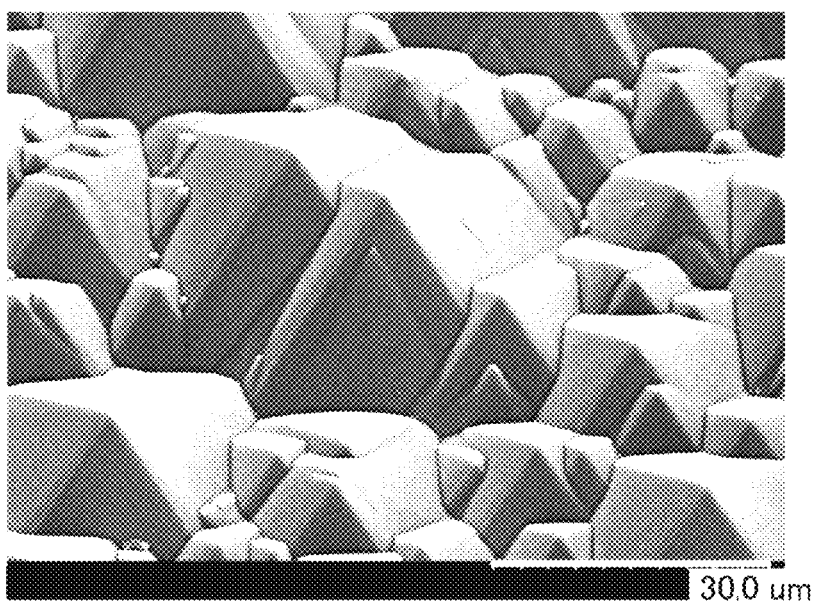
FIGS. 8A and 8B are SEM photographs each showing unevenness formed on a surface of a sample.
Figure 8B:
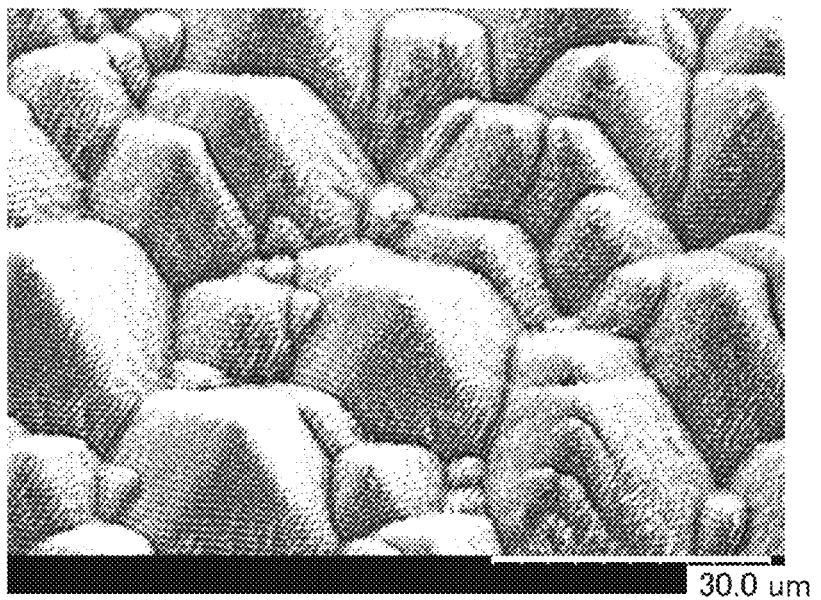

Further, a structure in which more minute unevenness (the distance between neighboring projections is less than or equal to 1 μm) is provided on the above uneven surface may be employed. FIG. 8A is a SEM photograph of Sample A having the above uneven surface, and FIG. 8B is a SEM photograph of Sample B in which more minute unevenness is formed on the above uneven surface. Note that the SEM photographs of FIGS. 8A and 8B were taken in a state where the samples were slanted at 30 degrees.

Figure 9:
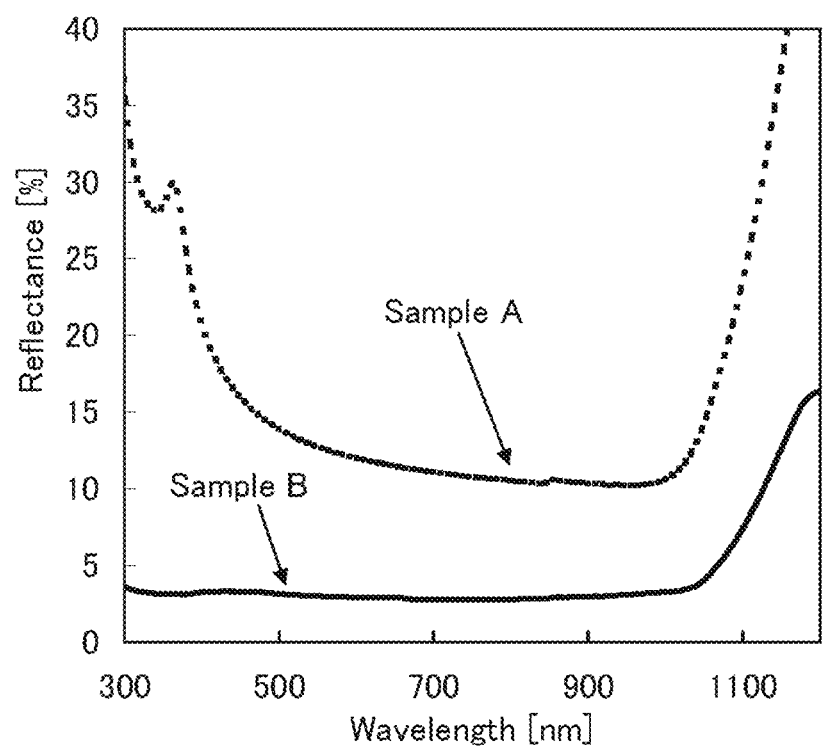
FIG. 9 is a graph showing reflectances of the samples.

FIG. 9 shows measurement results of surface reflectance of Sample A and Sample B. Sample A has high reflectance on a short wavelength side and a long wavelength side in a wavelength region of 300 nm to 1200 nm. The minimum value of the reflectance in the wavelength region is approximately 10%. On the other hand, Sample B has low reflectance in the entire wavelength region. In particular, the reflectance in a wavelength region of 300 nm to 1000 nm is as low as approximately 3%. Accordingly, by applying the structure of Sample B to a photoelectric conversion device, the surface reflectance is reduced, so that electric characteristics of the photoelectric conversion device can be improved.

Note that in this embodiment, described is an example in which by combination of the structure of Sample B and the light-transmitting semiconductor layer for generation of an electric field which is formed on the structure of Sample B, the amount of reflection and absorption of light by the surface is reduced, and thus electric characteristics of the photoelectric conversion device are improved; however, the structure of Sample B is not limited to being combined with the light-transmitting semiconductor layer. An excellent effect of reducing the reflectance can be obtained also by combination of the structure of Sample B with a silicon semiconductor layer for generation of an electric field.

In order to form the unevenness in which the distance between projections is less than or equal to 1 μm on a surface of silicon, for example, the surface of the silicon may be irradiated with pulsed laser light having a wavelength of 1030 nm. At this time, the scanning rate and the oscillation frequency of the laser light are adjusted so that the irradiation pitch of the laser light is less than or equal to 1 μm. For example, with use of a YAG laser having a pulse width of 1 psec and a wavelength of 1030 nm, the surface of the silicon may be processed under the following conditions: the oscillation frequency is 10 kHz and the scanning rate is 10 mm/sec. Note that when the irradiation pitch is less than 0.1 μm, the height difference of the unevenness is too small, and thus the reflectance is increased. Accordingly, the distance between the neighboring projections is preferably greater than or equal to 0.1 μm and less than or equal to 1 μm. Further, in order to make the reflectance lower, the height difference of the unevenness is also preferably greater than or equal to 0.1 μm and less than or equal to 1 μm.

The first silicon semiconductor layer 111 and the third silicon semiconductor layer 113 are i-type semiconductor layers each containing hydrogen and few defects and can eliminate defects on the surfaces of the crystalline silicon substrate 100. Note that in this specification, an "i-type semiconductor" refers not only to a so-called intrinsic semiconductor in which the Fermi level lies in the middle of the band gap, but also to a semiconductor in which the concentration of each of an impurity imparting p-type conductivity and an impurity imparting n-type conductivity is less than or equal to $1 \times 10^{20}$ cm$^{-3}$, and in which the photoconductivity is higher than the dark conductivity. This i-type silicon semiconductor may include an element belonging to Group 13 or Group 15 in the periodic table as an impurity element.

The crystalline silicon substrate 100 has one conductivity type, and the light-transmitting semiconductor layer 150 is a semiconductor layer having the opposite conductivity type to that of the crystalline silicon substrate 100. Thus, a p-n junction is formed between the crystalline silicon substrate 100 and the light-transmitting semiconductor layer 150 with the first silicon semiconductor layer 111 provided therebetween. Here, since the light-transmitting semiconductor layer 150 according to one embodiment of the present invention has p-type conductivity, as the crystalline silicon substrate 100, a crystalline silicon substrate having n-type conductivity is used.

The fourth silicon semiconductor layer 114 provided on the back surface side of the crystalline silicon substrate 100 has higher carrier concentration than the crystalline silicon substrate 100 having n-type conductivity and has n$^+$-type conductivity. Thus, an n-n$^+$ junction is formed between the crystalline silicon substrate 100 and the fourth silicon semiconductor layer 114 with the third silicon semiconductor layer 113 provided therebetween. In other words, the fourth silicon semiconductor layer 114 functions as a Back Surface Field (BSF) layer. Minority carriers are repelled by the electric field of the n-n$^+$ junction and attracted to the p-n junction side, whereby recombination of carriers in the vicinity of the second electrode 190 can be prevented.

As an alternative to the fourth silicon semiconductor layer 114, an n-type light-transmitting conductive film may be used. For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film is not limited to a single layer, and a stacked structure of different films may be employed. The light-transmitting conductive film serves not only as an electric field forming layer but also as a film for promoting reflection of light that has reached the second electrode 190.

The light-transmitting semiconductor layer 150 in one embodiment of the present invention is formed using a composite material of an inorganic compound and an organic compound. As the inorganic compound, transition metal oxide can be used. Among the transition metal oxide, an oxide of a metal belonging to any of Groups 4 to 8 in the periodic table is particularly preferable. Specifically, vanadium oxide, niobium oxide, tantalum oxide, chromium oxide, molybdenum oxide, tungsten oxide, manganese oxide, and rhenium oxide, or the like can be used. Among these metal oxides, molybdenum oxide is especially preferable since it is stable in the air, has a low hygroscopic property, and is easily handled.

As the organic compound, any of a variety of compounds such as an aromatic amine compound, a carbazole derivative, an aromatic hydrocarbon, and a heterocyclic compound having a dibenzofuran skeleton or a dibenzothiophene skeleton can be used. The organic compound may be a polymer including an oligomer and a dendrimer. As the organic compound used for the composite material, an organic compound having a high hole-transport property is used. Specifically, a substance having a hole mobility of greater than or equal to $10^{-6}$ cm$^2$/Vs is preferably used. However, substances other than the above described materials may also be used as long as the substances have higher hole-transport properties than electron-transport properties.

The transition metal oxide has an electron-accepting property. A composite material of an organic compound having a high hole-transport property and such a transition metal oxide has high carrier density and exhibits p-type semiconductor characteristics. The composite material has high transmittance of light in a wide wavelength range from visible light region to infrared region. Further, the refractive index of the composite material is close to that of a light-transmitting conductive film such as an ITO film, so that it is possible to use the composite material for an anti-reflection film by adjusting the film thickness as appropriate.

The composite material is stable, and silicon oxide is not generated at an interface between the crystalline silicon substrate 100 and the light-transmitting semiconductor layer 150; thus, defects at the interface can be reduced, resulting in improvement in lifetime of carriers.

In the case where the composite material is formed as a passivation film on both of surfaces (a front surface and a back surface) of an n-type single crystal silicon substrate, the following has been confirmed by the experiment: the lifetime of carriers is 700 μsec or more when 4-phenyl-4'-(9-phenylfluoren-9-yl)triphenylamine (abbreviation: BPAFLP) and molybdenum(VI) oxide are used as the organic compound and the inorganic compound respectively; the lifetime of carriers is 400 μsec or more when 4,4'-bis[N-(1-naphthyl)-N-phenylamino]biphenyl (abbreviation: NPB) and molybdenum(VI) oxide are used as the organic compound and the inorganic compound respectively. Note that the lifetime of carriers in the case where an n-type single crystal silicon substrate is not provided with a passivation film is about 40 μsec, and the lifetime of carriers in the case where indium tin oxide (ITO) is formed on both of surfaces of the single crystal silicon substrate by a sputtering method is about 30 μsec.

In the conventional photoelectric conversion devices, since an impurity layer formed on a surface layer of a crystalline silicon substrate functions as a window layer, the window layer has a light absorption property which is almost equivalent to that of a light absorption region on the back electrode side which is the opposite side of the p-n junction. Although photo-carriers are generated in the window layer, the lifetime of minority carrier is short and the carriers cannot be extracted as current. Thus, the light absorption in the window layer causes a significantly large loss in the conventional photoelectric conversion devices.

In one embodiment of the present invention, the light-transmitting composite material is used for a window layer of the photoelectric conversion device in which the n-type crystalline silicon substrate serves as a light absorption layer, whereby the light loss caused by light absorption in the window layer is reduced, and photoelectric conversion can be efficiently performed in the light absorption region. Further, as described above, the composite material has extremely high passivation effect on the silicon surface. Accordingly, the photoelectric conversion efficiency of the photoelectric conversion device can be improved.

Note that in one embodiment of the present invention, the second silicon semiconductor layer 112 preferably has $p^+$-type conductivity and higher carrier concentration than the light-transmitting semiconductor layer 150. When the second silicon semiconductor layer 112 has $p^+$-type conductivity, contact resistance between the first electrode 170 and the light-transmitting semiconductor layer 150 can be reduced. Further, the second silicon semiconductor layer 112 is partially formed only below the first electrode 170 which is a grid electrode on the light-receiving surface side and over the crystalline silicon substrate 100; therefore, the light loss caused by light absorption by the second silicon semiconductor layer 112 does not need to be considered.

Figure 2:
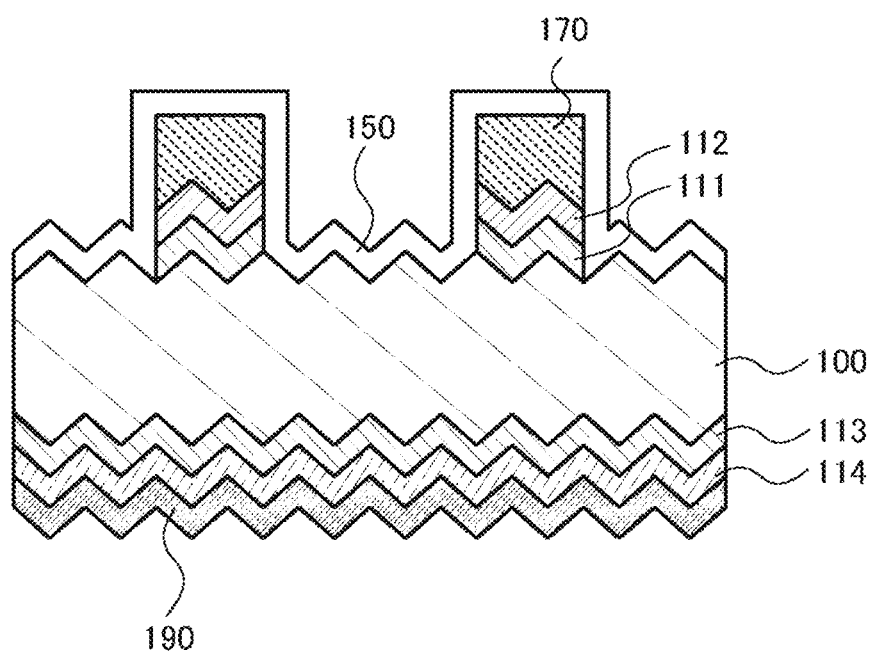
FIG. 2 is a cross-sectional view illustrating a photoelectric conversion device according to one embodiment of the present invention.

Further, as illustrated in FIG. 2, a stacked layer including the first silicon semiconductor layer 111, the second silicon semiconductor layer 112, and the first electrode 170 may be formed on the crystalline silicon substrate 100, and the light-transmitting semiconductor layer 150 may be formed so as to cover the light-receiving surface (i.e., the crystalline silicon substrate 100, the first silicon semiconductor layer 111, the second silicon semiconductor layer 112, and the first electrode 170). With such a structure, the internal electric field formed in a portion where a PN junction is formed can be increased, so that a fill factor and an open circuit voltage can be improved.

Figure 3:
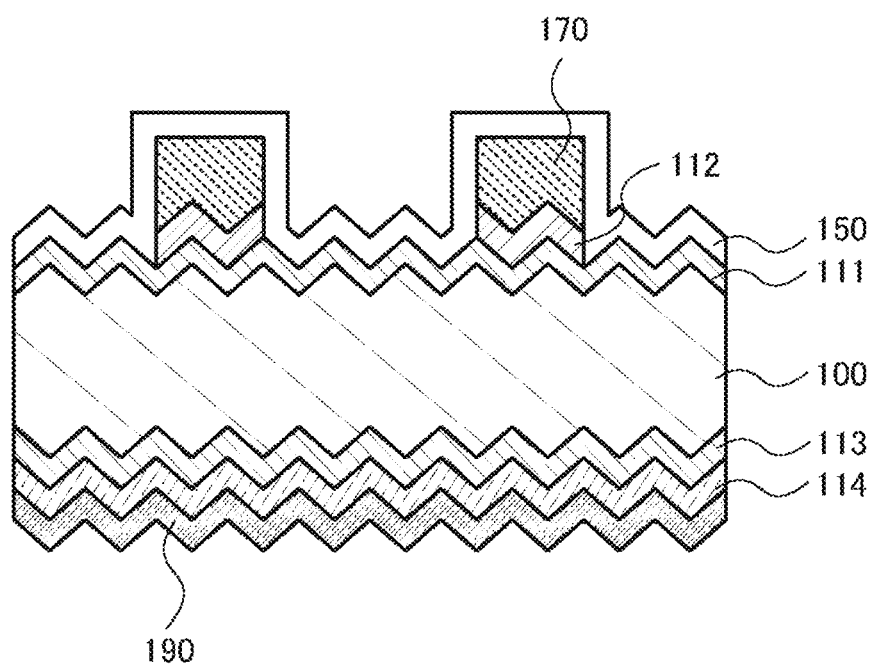
FIG. 3 is a cross-sectional view illustrating a photoelectric conversion device according to one embodiment of the present invention.

Further, a structure illustrated in FIG. 3 in which the first silicon semiconductor layer 111 is formed on the crystalline silicon substrate 100, a stacked layer including the second silicon semiconductor layer 112 and the first electrode 170 is formed on the first silicon semiconductor layer 111, and the light-transmitting semiconductor layer 150 is formed so as to cover the light-receiving surface (i.e., the crystalline silicon substrate 100, the first silicon semiconductor layer 111, the second silicon semiconductor layer 112, and the first electrode 170) may be employed. With such a structure, an effect of increasing the internal electric field and an effect of reducing the surface defects of the crystalline silicon substrate can be exerted at the same time, so that an open circuit voltage can be improved.

Figure 4:
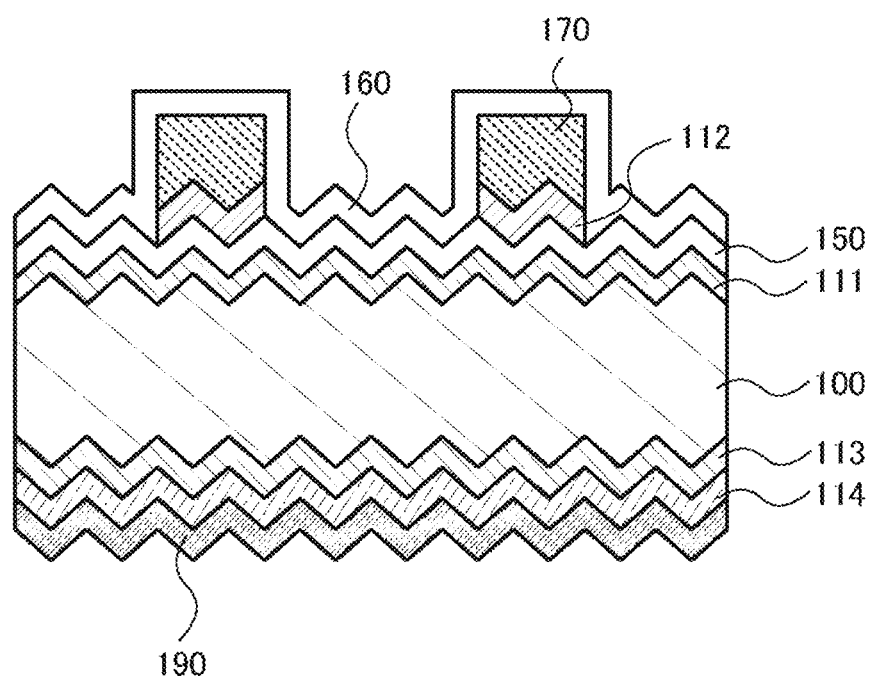
FIG. 4 is a cross-sectional view illustrating a photoelectric conversion device according to one embodiment of the present invention.

Moreover, as illustrated in FIG. 4, a light-transmitting conductive film 160 may be provided so as to be in contact with the light-transmitting semiconductor layer 150. Providing the light-transmitting conductive film 160 enables the resistance loss in the light-transmitting semiconductor layer 150 to be reduced. Note that the structure illustrated in FIG. 4 is one example, and a structure in which the light-transmitting conductive film 160 is not in contact with the first electrode 170 may be employed. Further, the light-transmitting conductive film 160 may be provided between the light-transmitting semiconductor layer 150 and the second silicon semiconductor layer 112.

Figure 5:
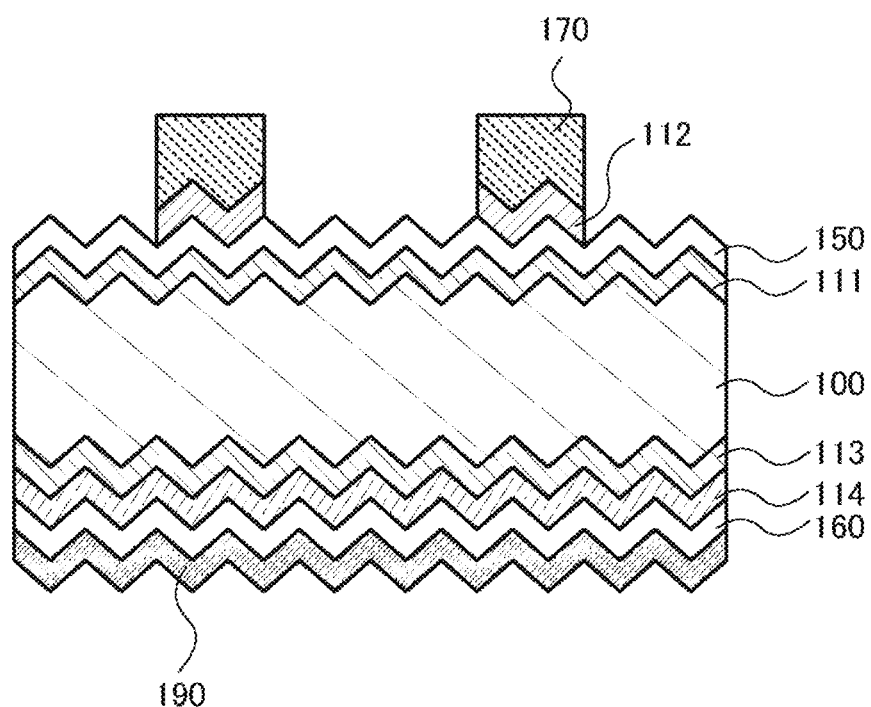
FIG. 5 is a cross-sectional view illustrating a photoelectric conversion device according to one embodiment of the present invention.

Furthermore, as illustrated in FIG. 5, the light-transmitting conductive film 160 may be provided between the fourth silicon semiconductor layer 114 and the second electrode 190. By providing the light-transmitting conductive film 160, an interface having high birefringence is generated between the light-transmitting conductive film and the second electrode 190; thus, the reflectance can be improved. Accordingly, a substantial optical path length in the crystalline silicon substrate can be lengthened, so that short-circuit current can be improved.

Note that the structures of FIGS. 1A and 1B, FIG. 2, FIG. 3, FIG. 4, and FIG. 5 may be combined as appropriate.

Next, a method for manufacturing the photoelectric conversion device, which is illustrated in FIG. 1A, will be described with reference to FIGS. 6A to 6C and FIGS. 7A to 7C.

A single crystal silicon substrate or a polycrystalline silicon substrate, which has n-type conductivity, can be used for the crystalline silicon substrate 100 which can be used in one embodiment of the present invention. The manufacturing method of the crystalline silicon substrate is not specifically limited. In this embodiment, a single crystal silicon substrate whose surface corresponds to the (100) plane and which is manufactured by a Magnetic Czochralski (MCZ) method is used.

Figure 6A:
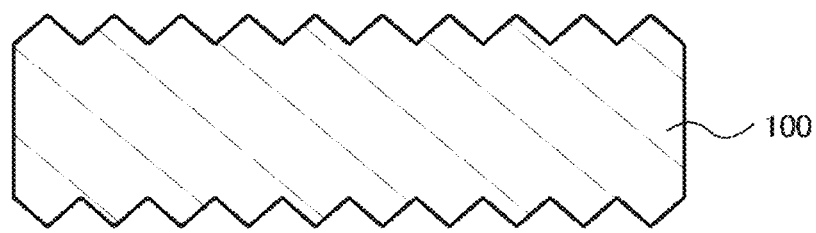
FIGS. 6A to 6C are cross-sectional views illustrating a process of a manufacturing method of a photoelectric conversion device according to one embodiment of the present invention.

Next, the surface and the back surface of the crystalline silicon substrate 100 are processed to have unevenness (see FIG. 6A). Note that here, an example in which the above-described single crystal silicon substrate having a (100) plane as a surface is used is employed to describe a method for processing the crystalline silicon substrate 100 to have unevenness. In the case where a polycrystalline silicon substrate is used as the crystalline silicon substrate 100, unevenness may be formed by a dry etching method or the like.

In the case where the initial single crystal silicon substrate is a substrate which is subjected to only a slicing process, a damage layer with a thickness of 10 μm to 20 μm, remaining on the surface of the single crystal silicon substrate, is removed by a wet etching process. For an etchant, an alkaline solution with a relatively high concentration, for example, a 10 to 50% sodium hydroxide aqueous solution or a 10 to 50% potassium hydroxide aqueous solution can be used. Alternatively, a mixed acid in which hydrofluoric acid and nitric acid are mixed, or the mixed acid to which acetic acid is further added may be used.

Next, impurities adsorbed on the surface of the single crystal silicon substrate from which the damage layer has been removed are removed by acid cleaning. As an acid, for example, a mixture (FPM) of 0.5% hydrofluoric acid and 1% hydrogen peroxide, or the like can be used. Alternatively, RCA cleaning or the like may be performed. Note that this acid cleaning may be omitted.

The unevenness is formed utilizing a difference in etching rates depending on plane orientations in etching of the crystalline silicon using an alkaline solution. For an etchant, an alkaline solution with a relatively low concentration, for example, a 1 to 5% sodium hydroxide aqueous solution, or a 1 to 5% potassium hydroxide aqueous solution can be used, and preferably several percent isopropyl alcohol is added thereto. The temperature of the etchant is 70° C. to 90° C., and the single crystal silicon substrate is soaked in the etchant for 30 to 60 minutes. By this treatment, unevenness including a plurality of minute projections each having a substantially square pyramidal shape and recessions formed between adjacent projections can be formed on the surfaces of the single crystal silicon substrate.

Next, oxide layers which are non-uniformly formed on the silicon surface in the etching step for forming the unevenness are removed. Another purpose of removing the oxide layers is to remove a component of the alkaline solution, which is likely to remain in the oxide layers. When an alkali metal ion, e.g., a Na ion or a K ion enters silicon, the lifetime is decreased, and the electric characteristics of the photoelectric conversion device are drastically lowered as a result. Note that in order to remove the oxide layers, a 1 to 5% diluted hydrofluoric acid may be used.

Next, the surfaces of the single crystal silicon substrate are preferably etched with a mixed acid in which hydrofluoric acid and nitric acid are mixed, or the mixed acid to which acetic acid is further added so that impurities such as a metal component are removed from the surfaces. By adding the acetic acid, oxidizing ability of nitric acid can be kept so as to stably perform the etching, and the etching rate can be adjusted. For example, the volume ratio of hydrofluoric acid (approximately 50%), nitric acid (60% or more), and acetic acid (90% or more) can be 1:1.5 to 3:2 to 4. Note that in this specification, the mixed acid solution containing hydrofluoric acid, nitric acid, and acetic acid is referred to as HF-nitric-acetic acid. In the etching with the HF-nitric-acetic acid, angles in cross sections of vertexes of the projections are made larger, so that a surface area can be reduced, and the absolute amount of surface defects can be reduced. Note that in the case where the etching with the HF-nitric-acetic acid is performed, the above step of removing the oxide layers with diluted hydrofluoric acid can be omitted. Through the steps up to here, the surfaces of the single crystal silicon substrate can have unevenness.

Next, after appropriate cleaning, the third silicon semiconductor layer 113 is formed on the back surface of the crystalline silicon substrate 100 which is a side opposite to the light-receiving surface by a plasma CVD method. The thickness of the third silicon semiconductor layer 113 is preferably greater than or equal to 3 nm and less than or equal to 50 nm. In this embodiment, the third silicon semiconductor layer 113 is i-type amorphous silicon and has a thickness of 5 nm. Note that i-type microcrystalline silicon may be used for the third silicon semiconductor layer 113.

The third silicon semiconductor layer 113 can be formed, for example, under the following conditions: monosilane is introduced to a reaction chamber at a flow rate greater than or equal to 5 sccm and less than or equal to 200 sccm; the pressure inside the reaction chamber is higher than or equal to 100 Pa and lower than or equal to 200 Pa; the distance between electrodes is greater than or equal to 10 mm and less than or equal to 40 mm; and the power density based on the area of a cathode electrode is greater than or equal to 8 mW/cm$^2$ and less than or equal to 120 mW/cm$^2$.

Figure 6B:
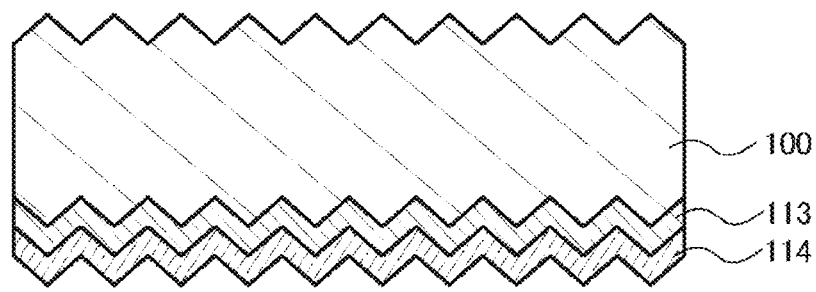

Next, the fourth silicon semiconductor layer 114 is formed on the third silicon semiconductor layer 113 (see FIG. 6B). The thickness of the fourth silicon semiconductor layer 114 is preferably greater than or equal to 3 nm and less than or equal to 50 nm. In this embodiment, the fourth silicon semiconductor layer 114 is n-type microcrystalline silicon or n-type amorphous silicon, and has a film thickness of 10 nm.

The fourth silicon semiconductor layer 114 can be formed, for example, under the following conditions: monosilane and hydrogen-based phosphine (0.5%) are introduced to a reaction chamber at a flow rate ratio of 1:1 to 50; the pressure inside the reaction chamber is higher than or equal to 100 Pa and lower than or equal to 200 Pa; the distance between electrodes is greater than or equal to 10 mm and less than or equal to 40 mm; the power density based on the area of a cathode electrode is greater than or equal to 8 mW/cm$^2$ and less than or equal to 120 mW/cm$^2$; and the substrate temperature is higher than or equal to 150° C. and lower than or equal to 300° C.

Next, the first silicon semiconductor layer 111 is formed on the surface of the crystalline silicon substrate 100 on the light-receiving surface side, by a plasma CVD method. The thickness of the first silicon semiconductor layer 111 is preferably greater than or equal to 3 nm and less than or equal to 50 nm. In this embodiment, the first silicon semiconductor layer 111 is an i-type amorphous silicon film and has a thickness of 5 nm. Note that i-type microcrystalline silicon may be used for the first silicon semiconductor layer 111. The first silicon semiconductor layer 111 can be formed under conditions similar to those of the third silicon semiconductor layer 113.

Then, the light-transmitting semiconductor layer 150 is formed on the first silicon semiconductor layer 111. The light-transmitting semiconductor layer 150 is formed using the above inorganic compound and organic compound by a co-evaporation method. Note that the co-evaporation method is an evaporation method in which evaporation is carried out from a plurality of evaporation sources at the same time in one treatment chamber. It is preferable that deposition be performed in a reduced-pressure atmosphere. The reduced-pressure atmosphere can be obtained by evacuation of a deposition chamber with a vacuum evacuation unit to a vacuum of about $5 \times 10^{-3}$ Pa or less, preferably, about $10^{-4}$ Pa to $10^{-6}$ Pa.

In this embodiment, the light-transmitting semiconductor layer 150 is formed by co-evaporating BPAFLP and molybdenum(VI) oxide. The thickness of the light-transmitting semiconductor layer 150 is 50 nm, and the weight ratio of BPAFLP to molybdenum oxide is controlled to be 2:1 (=BPAFLP:molybdenum oxide).

Figure 6C:
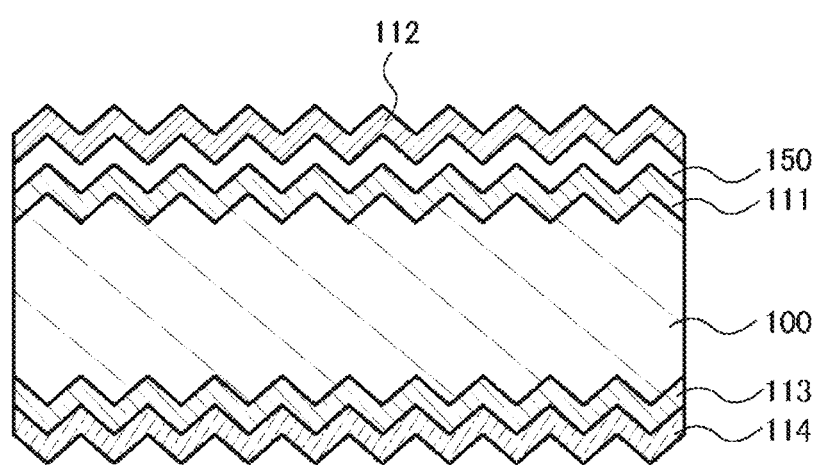

Next, the second silicon semiconductor layer 112 is formed on the light-transmitting semiconductor layer 150 (see FIG. 6C). The thickness of the second silicon semiconductor layer 112 is preferably greater than or equal to 3 nm and less than or equal to 50 nm. In this embodiment, the second silicon semiconductor layer 112 is a p-type microcrystalline silicon film or a p-type amorphous silicon film, and has a thickness of 10 nm.

The second silicon semiconductor layer 112 can be formed, for example, under the following conditions: monosilane and hydrogen-based diborane (0.1%) are introduced to a reaction chamber at a flow rate ratio of 1:2 to 50; the pressure inside the reaction chamber is higher than or equal to 100 Pa and lower than or equal to 200 Pa; the distance between electrodes is greater than or equal to 8 mm and less than or equal to 40 mm; the power density based on the area of a cathode electrode is greater than or equal to 8 mW/cm$^2$ and less than or equal to 50 mW/cm$^2$; and the substrate temperature is higher than or equal to 150° C. and lower than or equal to 300° C.

Note that in this embodiment, although an RF power source with a frequency of 13.56 MHz is used as a power source in forming the first silicon semiconductor layer 111, the second silicon semiconductor layer 112, the third silicon semiconductor layer 113, and the fourth silicon semiconductor layer 114, an RF power source with a frequency of 27.12 MHz, 60 MHz, or 100 MHz may be used instead. In addition, the deposition may be carried out by not only continuous discharge but also pulse discharge. The implementation of pulse discharge can improve the film quality and reduce particles produced in the gas phase.

Note that the formation order of the films provided on the surface and the back surface of the crystalline silicon substrate 100 is not limited to the order described above as long as the structure illustrated in FIG. 6C can be obtained. For example, the formation of the first silicon semiconductor layer 111 may follow the formation of the third silicon semiconductor layer 113 prior to the formation of the fourth silicon semiconductor layer 114.

Figure 7A:
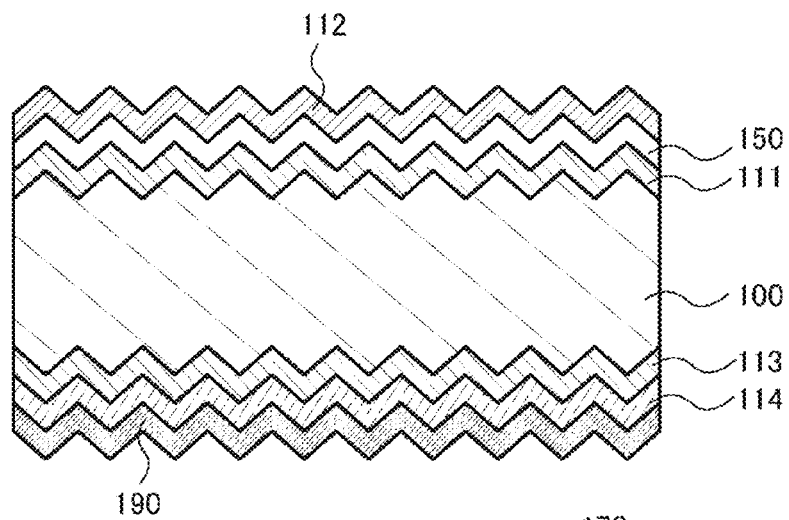
FIGS. 7A to 7C are cross-sectional views illustrating a process of the manufacturing method of the photoelectric conversion device according to one embodiment of the present invention.

Next, the second electrode 190 is formed on the fourth silicon semiconductor layer 114 (see FIG. 7A). The second electrode 190 can be formed using a low-resistance metal such as silver, aluminum, or copper by a sputtering method, a vacuum evaporation method, or the like. Alternatively, the second electrode 190 may be formed using a resin containing a conductive material (hereinafter, referred to as a conductive resin) such as a silver paste or a copper paste by a screen printing method.

Figure 7B:
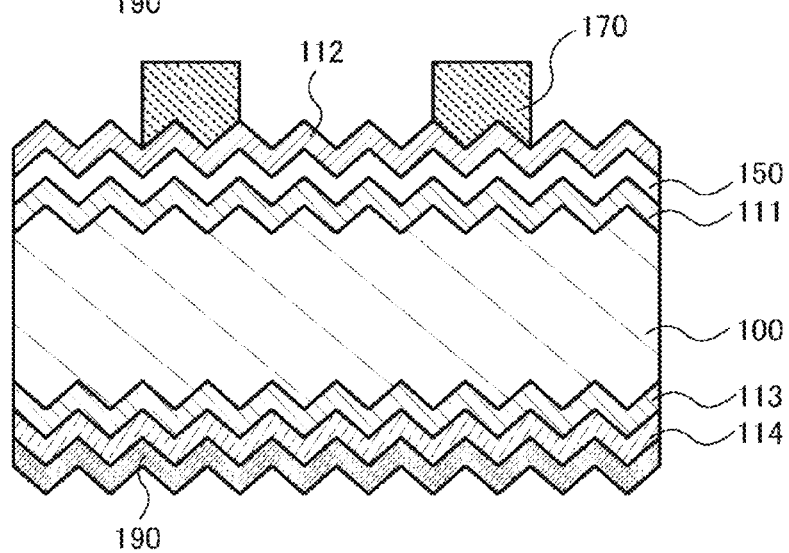

Next, the first electrode 170 is formed on the second silicon semiconductor layer 112 (see FIG. 7B). The first electrode 170 is a grid electrode, which is preferably formed using a conductive resin such as a silver paste, a copper paste, a nickel paste, or a molybdenum paste by a screen printing method. Further, the second electrode 190 may be a stacked layer of different materials, such as a stacked layer of a silver paste and a copper paste.

Figure 7C:
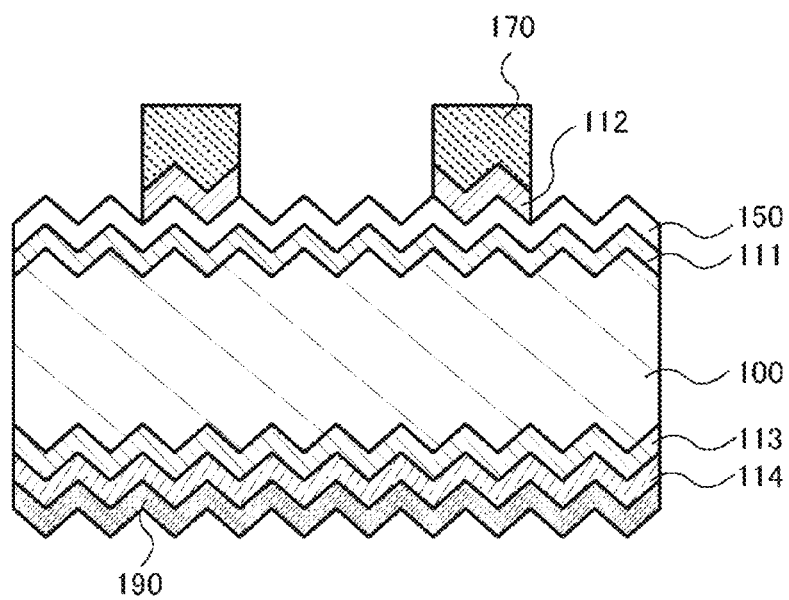

Next, the second silicon semiconductor layer 112 is etched using the first electrode 170 as a mask, so that a structure in which the second silicon semiconductor layer 112 remains only below the first electrode 170 is obtained (see FIG. 7C). The etching may be performed by a known method. The composition of the second silicon semiconductor layer 112 is largely different from that of the light-transmitting semiconductor layer 150; therefore, etching with high selectivity is possible.

Note that the photoelectric conversion device having the structure illustrated in FIG. 2 may be formed in such a manner that the first silicon semiconductor layer 111, the second silicon semiconductor layer 112, and the first electrode 170 are formed over the crystalline silicon substrate 100, and after that, the first silicon semiconductor layer 111 and the second silicon semiconductor layer 112 are etched by a known method, and then the light-transmitting semiconductor layer 150 is formed so as to cover the light-receiving surface.

Further, the photoelectric conversion device having the structure illustrated in FIG. 3 may be formed in such a manner that the first silicon semiconductor layer 111, the second silicon semiconductor layer 112, and the first electrode 170 are formed over the crystalline silicon substrate 100, and after that, only the second silicon semiconductor layer 112 is etched by a known method, and then the light-transmitting semiconductor layer 150 is formed so as to cover the light-receiving surface.

Moreover, the photoelectric conversion device having the structure illustrated in FIG. 4 may be formed in such a manner that the light-transmitting conductive film is formed so as to cover the light-receiving surface side in the structure illustrated in FIG. 1A. For the light-transmitting conductive film, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene, or the like. The light-transmitting conductive film is not limited to a single layer, and may have a stacked structure of different films. For example, a stacked layer of indium tin oxide and zinc oxide containing aluminum, a stacked layer of indium tin oxide and tin oxide containing fluorine, etc. can be used. The total thickness is greater than or equal to 10 nm and less than or equal to 1000 nm.

Further, the photoelectric conversion device having the structure illustrated in FIG. 5 may be formed in such a manner that the light-transmitting conductive film is formed using any of the above materials on the fourth silicon semiconductor layer 114 illustrated in FIG. 6B.

In the above manner, the photoelectric conversion device in which the light-transmitting semiconductor layer is used as a window layer, which is one embodiment of the present invention, can be manufactured.

This embodiment can be freely combined with another embodiment.

Embodiment 2

In this embodiment, the light-transmitting semiconductor layer described in Embodiment 1 will be described.

For the light-transmitting semiconductor layer 150 in any of the photoelectric conversion devices described in Embodiment 1, a composite material of a transition metal oxide and an organic compound can be used. Note that, in this specification, the word "composite" means not only a state in which two materials are simply mixed but also a state in which a plurality of materials are mixed and charges are transferred between the materials.

As the transition metal oxide, a transition metal oxide having an electron-accepting property can be used. Specifically, among transition metal oxides, an oxide of a metal belonging to any of Groups 4 to 8 of the periodic table is preferable. In particular, it is preferable to use vanadium oxide, niobium oxide, tantalum oxide, chromium oxide, molybdenum oxide, tungsten oxide, manganese oxide, or rhenium oxide because of their high electron-accepting properties. Among these, molybdenum oxide is especially preferable since it is stable in the air, has a low hygroscopic property, and is easily handled.

As the organic compound, any of a variety of compounds such as an aromatic amine compound, a carbazole derivative, an aromatic hydrocarbon, and a heterocyclic compound having a dibenzofuran skeleton or a dibenzothiophene skeleton can be used. The organic compound may be a polymer (including an oligomer and a dendrimer). Note that the organic compound used for the composite material is preferably an organic compound having a high hole-transport property. Specifically, a substance having a hole mobility of $10^{-6}$ cm$^2$/Vs or higher is preferably used. However, a substance other than the above-described substances may also be used as long as a hole-transport property thereof is higher than an electron-transport property thereof.

In a composite material of the above-described transition metal oxide and the above-described organic compound, electrons in the highest occupied molecular orbital level (HOMO level) of the organic compound are transferred to the conduction band of the transition metal oxide, whereby interaction between the transition metal oxide and the organic compound occurs. Due to this interaction, the composite material including the transition metal oxide and the organic compound has high carrier concentration and has p-type semiconductor characteristics.

The organic compounds which can be used for the composite material will be specifically shown below.

As the aromatic amine compounds that can be used for the composite material, the following can be given as examples: NPB; N,N'-bis(3-methylphenyl)-N,N'-diphenyl-[1,1'-biphenyl]-4,4'-diamine (abbreviation: TPD); 4,4',4''-tris(N,N- diphenylamino)triphenylamine (abbreviation: TDATA); 4,4',4''-tris[N-(3-methylphenyl)-N-phenylamino]triphenylamine (abbreviation: MTDATA); and N,N-bis(spiro-9,9'-bifluoren-2-yl)-N,N-diphenylbenzidine (abbreviation: BSPB). In addition, the following can be given: N,N'-bis(4-methylphenyl)-N,N'-diphenyl-p-phenylenediamine (abbreviation: DTDPPA); 4,4'-bis[N-(4-diphenylaminophenyl)-N-phenylamino]biphenyl (abbreviation: DPAB); N,N'-bis[4-[bis(3-methylphenyl)amino]phenyl]-N,N'-diphenyl-[1,1'-biphenyl]-4,4'-diamine (abbreviation: DNTPD); 1,3,5-tris[N-(4-diphenylaminophenyl)-N-phenylamino]benzene (abbreviation: DPA3B); BPAFLP; and 4,4'-bis[N-(9,9-dimethylfluoren-2-yl)-N-phenylamino]biphenyl (abbreviation: DFLDPBi).

As the carbazole derivatives that can be used for the composite material, the following can be given specifically: 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); 3-[N-(1-naphthyl)-N-(9-phenylcarbazol-3-yl)amino]-9-phenylcarbazole (abbreviation: PCzPCN1); and the like.

Examples of the carbazole derivatives that can be used for the composite material further include 4,4'-di(N-carbazolyl)biphenyl (abbreviation: CBP), 1,3,5-tris[4-(N-carbazolyl)phenyl]benzene (abbreviation: TCPB), 9-[4-(N-carbazolyl)]phenyl-10-phenylanthracene (abbreviation: CzPA), 1,4-bis[4-(N-carbazolyl)phenyl]-2,3,5,6-tetraphenylbenzene, and the like.

As the aromatic hydrocarbon that can be used for the composite material, the following can be given as examples: 2-tert-butyl-9,10-di(2-naphthyl)anthracene (abbreviation: t-BuDNA); 2-tert-butyl-9,10-di(1-naphthyl)anthracene; 9,10-bis(3,5-diphenylphenyl)anthracene (abbreviation: DPPA); 2-tert-butyl-9,10-bis(4-phenylphenyl)anthracene (abbreviation: t-BuDBA); 9,10-di(2-naphthyl)anthracene (abbreviation: DNA); 9,10-diphenylanthracene (abbreviation: DPAnth); 2-tert-butylanthracene (abbreviation: t-BuAnth); 9,10-bis(4-methyl-1-naphthyl)anthracene (abbreviation: DMNA); 9,10-bis[2-(1-naphthyl)phenyl]-2-tert-butylanthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides those, pentacene, coronene, or the like can also be used. As described above, an aromatic hydrocarbon which has a hole mobility of $1 \times 10^{-6}$ cm$^2$/Vs or more and 14 to 42 carbon atoms is more preferable.

The aromatic hydrocarbon that can be used for the composite material may have a vinyl skeleton. As the aromatic hydrocarbon having a vinyl group, the following can be given for example: 4,4'-bis(2,2-diphenylvinyl)biphenyl (abbreviation: DPVBi); 9,10-bis[4-(2,2-diphenylvinyl)phenyl]anthracene (abbreviation: DPVPA); and the like.

The organic compound that can be used for the composite material may be a heterocyclic compound having a dibenzofuran skeleton or a dibenzothiophene skeleton.

The organic compound that can be used for the composite material may be a polymer, and the following can be given as examples: poly(N-vinylcarbazole) (abbreviation: PVK); poly(4-vinyltriphenylamine) (abbreviation: PVTPA); poly[N-(4-{N'-[4-(4-diphenylamino)phenyl]phenyl-N'-phenylamino}phenyl)methacrylamide](abbreviation: PTPDMA); poly[N,N'-bis(4-butylphenyl)-N,N'-bis(phenyl)benzidine] (abbreviation: Poly-TPD); and the like.

The light-transmitting semiconductor layer described in this embodiment has high light-transmitting property with respect to light in a wavelength range, which is absorbed by crystalline silicon. Thus, the light-transmitting semiconductor layer can be formed thick as compared with the thickness of the silicon semiconductor layer in the case of being used for the window layer, so that the resistance can be reduced and the resistance loss can be reduced.

A variety of methods can be used for forming the light-transmitting semiconductor layer regardless of whether the method is a dry process or a wet process. As a dry method, a co-evaporation method, by which a plurality of evaporation materials is vaporized from a plurality of evaporation sources to perform deposition, and the like are given as examples. As a wet method, a composition having a composite material is prepared by a sol-gel method or the like, and deposition of the light-transmitting semiconductor layer can be performed by applying the composite material with an ink-jet method or a spin-coating method.

When the above-described light-transmitting semiconductor layer is used for a window layer of a photoelectric conversion device, the light loss caused by light absorption in the window layer is reduced, and the electric characteristics of the photoelectric conversion device can be improved.

This embodiment can be freely combined with another embodiment.

This application is based on Japanese Patent Application serial no. 2011-159797 filed with Japan Patent Office on Jul. 21, 2011, the entire contents of which are hereby incorporated by reference.

What is claimed is:

1. A photoelectric conversion device comprising:
    a crystalline silicon substrate;
    a first silicon semiconductor layer over the crystalline silicon substrate, the first silicon semiconductor layer partially covering a surface of the crystalline silicon substrate;
    a second silicon semiconductor layer over the first silicon semiconductor layer;
    a first electrode over the second silicon semiconductor layer; and
    a light-transmitting semiconductor layer covering the crystalline silicon substrate, the first silicon semiconductor layer, the second silicon semiconductor layer, and the first electrode,
    wherein the light-transmitting semiconductor layer comprises an organic compound and an inorganic compound and is in direct contact with the crystalline silicon substrate.

2. The photoelectric conversion device according to claim 1, further comprising:
    a third silicon semiconductor layer over another surface of the crystalline silicon substrate;
    a fourth silicon semiconductor layer over the third silicon semiconductor layer; and
    a second electrode over the fourth silicon semiconductor layer.

3. The photoelectric conversion device according to claim 1, wherein the inorganic compound is selected from a transition metal oxide.

4. The photoelectric conversion device according to claim 1, wherein the inorganic compound is selected from a metal oxide of a metal of Groups 4 to 8 of the periodic table.

5. The photoelectric conversion device according to claim 1, wherein the inorganic compound is molybdenum oxide.

6. The photoelectric conversion device according to claim 1, wherein the inorganic compound and the organic compound are selected so that charge transfer occurs therebetween.

7. The photoelectric conversion device according to claim 1,
wherein the surface of the crystalline silicon substrate has a plurality of projections.

8. The photoelectric conversion device according to claim 7, wherein a distance between the neighboring projections is less than or equal to 1 μm.

9. The photoelectric conversion device according to claim 1,
wherein the light-transmitting semiconductor layer is in contact with a side surface of the second silicon semiconductor layer.

10. The photoelectric conversion device according to claim 1,
wherein the light-transmitting semiconductor layer is in contact with a side surface of the first silicon semiconductor layer.

11. The photoelectric conversion device according to claim 7,
wherein the projections of the surface of the crystalline silicon substrate causes a projection at an interface between the second silicon semiconductor layer and the first electrode.

* * * * *